United States Patent
Tomisaki et al.

(10) Patent No.: US 11,609,264 B2
(45) Date of Patent: Mar. 21, 2023

(54) SIGNAL GENERATION APPARATUS AND ATTENUATION AMOUNT CORRECTION METHOD OF SIGNAL GENERATION APPARATUS

(71) Applicant: ANRITSU CORPORATION, Kanagawa (JP)

(72) Inventors: Koichiro Tomisaki, Kanagawa (JP); Jesse Paulo Valencia Macabasco, Kanagawa (JP)

(73) Assignee: ANRITSU CORPORATION, Kanagawa (JP)

(*) Notice: Subject to any disclaimer, the term of this patent is extended or adjusted under 35 U.S.C. 154(b) by 6 days.

(21) Appl. No.: 17/544,122

(22) Filed: Dec. 7, 2021

(65) Prior Publication Data
US 2022/0260629 A1   Aug. 18, 2022

(30) Foreign Application Priority Data
Feb. 16, 2021   (JP) .............................. JP2021-022565

(51) Int. Cl.
G01R 31/28    (2006.01)
G01R 31/319   (2006.01)

(52) U.S. Cl.
CPC ... *G01R 31/2841* (2013.01); *G01R 31/31905* (2013.01)

(58) Field of Classification Search
CPC ....... H04L 43/50; H04L 43/065; H04L 43/08; H04L 41/0803; H04L 12/2801; H04L 43/12; H04L 12/403; H04B 17/29; H04B 17/0085; H04B 17/309; H04B 17/101; H04B 17/15; H04W 24/06; G01R 23/00; G01R 31/31905; G01R 31/311; G01R 31/2841; G01R 31/2601; G01R 31/316; G06F 11/273; G06F 11/263; H04M 1/24
See application file for complete search history.

(56) References Cited

U.S. PATENT DOCUMENTS

| 6,144,265 A | * | 11/2000 | Dosdall | H03H 7/255 333/17.1 |
| 9,357,408 B2 | * | 5/2016 | Holzmann | G01R 1/206 |
| 10,317,503 B2 | * | 6/2019 | Yamashita | G01R 31/3191 |

FOREIGN PATENT DOCUMENTS

JP    2013-187803 A    9/2013

* cited by examiner

*Primary Examiner* — Vinh P Nguyen
(74) *Attorney, Agent, or Firm* — Pearne & Gordon LLP

(57) ABSTRACT

There is provided an attenuation amount setting unit that sets, in a case where signals are simultaneously output from all output ports of a plurality of interface units at the same signal level, one of the plurality of interface units as the reference interface unit, and adds a difference between an attenuation amount of a second attenuator stored in a storage unit of the reference interface unit and an attenuation amount of another second attenuator stored in another storage unit of the other interface unit to an attenuation amount of each of a plurality of third attenuators of the other interface unit to correct the attenuation amount.

2 Claims, 2 Drawing Sheets

SIGNAL GENERATION APPARATUS AND ATTENUATION AMOUNT CORRECTION METHOD OF SIGNAL GENERATION APPARATUS

TECHNICAL FIELD

The present invention relates to a signal generation apparatus that generates a modulated wave in a desired frequency bandwidth.

BACKGROUND ART

As a signal generation apparatus that generates a modulated wave in a desired frequency bandwidth, there is known, for example, a signal generation apparatus that generates a modulated wave in a desired frequency bandwidth by frequency-converting an intermediate frequency signal generated by any signal generator with a mixer or the like.

Such a signal generation apparatus is incorporated in, for example, a mobile terminal test device or the like that tests a mobile communication terminal, and generates and outputs a test signal.

Patent Document 1 discloses a wireless terminal measurement apparatus that includes a wireless terminal measurement module having a measurement function switchable to one supporting any of a plurality of communication standards and a chassis which can accommodate at least one wireless terminal measurement module, and is capable of arranging any number of wireless terminal measurement modules in a housing.

RELATED ART DOCUMENT

Patent Document

[Patent Document 1] JP-A-2013-187803

DISCLOSURE OF THE INVENTION

Problem that the Invention is to Solve

In this manner, in a case where a plurality of devices under test (DUTs) are connected for a test, the test can be effectively advanced by outputting test signals to the plurality of devices under test (DUTs) at once for the test. In such a case, it is necessary to adjust levels of the output signals to be the same for all the devices under test (DUTs).

However, in a case where an interface portion with the device under test (DUT) is modularized and detachable and a plurality of modules can be accommodated, the output signal level had to be adjusted each time the interface portion is replaced, and it takes time to adjust the device.

The present invention is to provide a signal generation apparatus capable of adjusting an output signal level in a short time in a case where signals are simultaneously output from all output ports at the same signal level, even in a configuration in which an output interface portion is modularized and detachable and a plurality of modules can be accommodated.

Means for Solving the Problem

According to an aspect of the present invention, there is provided a signal generation apparatus including: a signal generation unit that generates a test signal; a first attenuator that attenuates the signal generated by the signal generation unit; a plurality of interface units that distribute the signal attenuated by the first attenuator to a plurality of output ports, the interface unit including a second attenuator that attenuates the signal attenuated by the first attenuator, a distributor that distributes the signal attenuated by the second attenuator to the plurality of output ports, a plurality of third attenuators that attenuate the signals output from the distributor, respectively, and a storage unit that stores attenuation amounts of the second attenuator and each of the plurality of third attenuators so that output levels of the plurality of output ports are equal to each other; and an attenuation amount setting unit that sets, in a case where all the output ports of the plurality of interface units simultaneously output the signals at the same signal level, one of the plurality of interface units as a reference interface unit, and adds a difference between the attenuation amount of the second attenuator stored in the storage unit of the reference interface unit and the attenuation amount of the second attenuator stored in the storage unit of the other interface unit to the attenuation amount of each of the plurality of third attenuators of the other interface unit to correct the attenuation amount.

With this configuration, the attenuation amount is corrected by adding the difference between the attenuation amount of the second attenuator stored in the storage unit of the reference interface unit and the attenuation amount of the second attenuator stored in the storage unit of the other interface unit to the attenuation amount of each of the plurality of third attenuators of the other interface unit. Therefore, it is possible to adjust an output signal level in a short time in a case where signals are simultaneously output from all output ports at the same signal level, even in a configuration in which an output interface portion is modularized and detachable and a plurality of modules can be accommodated.

According to another aspect of the present invention, there is provided an attenuation amount correction method of a signal generation apparatus including a signal generation unit that generates a test signal, a first attenuator that attenuates the signal generated by the signal generation unit, and a plurality of interface units that distribute the signal attenuated by the first attenuator to a plurality of output ports, the interface unit including a second attenuator that attenuates the signal attenuated by the first attenuator, a distributor that distributes the signal attenuated by the second attenuator to the plurality of output ports, a plurality of third attenuators that attenuate the signals output from the distributor, respectively, and a storage unit that stores attenuation amounts of the second attenuator and each of the plurality of third attenuators so that output levels of the plurality of output ports are equal to each other, the method including: setting one of the plurality of interface units as a reference interface unit, and calculating a difference between the attenuation amount of the second attenuator stored in the storage unit of the reference interface unit and the attenuation amount of the second attenuator stored in the storage unit of the other interface unit; and adding the difference between the attenuation amount of the second attenuator stored in the storage unit of each of the other interface units and the attenuation amount of the second attenuator stored in the storage unit of the reference interface unit to the attenuation amount of each of the plurality of third attenuators to correct the attenuation amount.

With this configuration, the difference between the attenuation amount of the second attenuator stored in the storage unit of the reference interface unit and the attenuation amount of the second attenuator stored in the storage unit of the other interface unit is calculated, and the attenuation amount is corrected by adding the difference between the attenuation amount of the second attenuator stored in the storage unit of each of the other interface units and the attenuation amount of the second attenuator stored in the storage unit of the reference interface unit to the attenuation amount of each of the plurality of third attenuators. Therefore, it is possible to adjust an output signal level in a short time in a case where signals are simultaneously output from all output ports at the same signal level, even in a configuration in which an output interface portion is modularized and detachable and a plurality of modules can be accommodated.

Advantage of the Invention

According to the present invention, there is provided a signal generation apparatus capable of adjusting an output signal level in a short time in a case where signals are simultaneously output from all output ports at the same signal level, even in a configuration in which an output interface portion is modularized and detachable and a plurality of modules can be accommodated.

BEST MODE FOR CARRYING OUT THE INVENTION

Hereinafter, a signal generation apparatus according to an embodiment of the present invention will be described in detail with reference to the drawings.

Figure 1:
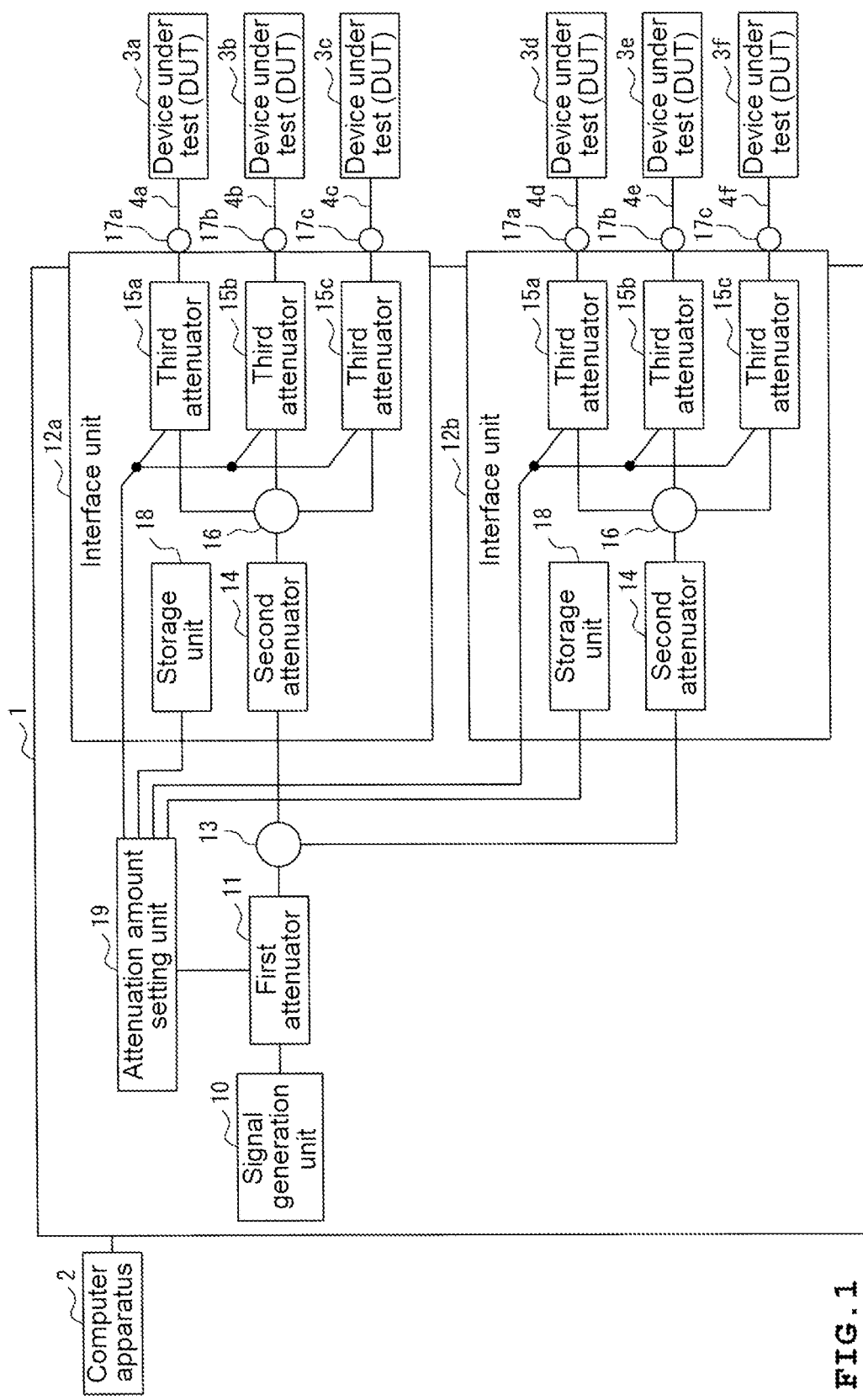
FIG. 1 is a block diagram of a signal generation apparatus according to an embodiment of the present invention.

As illustrated in FIG. 1, a computer apparatus 2 for control is connected to a signal generation apparatus 1. The computer apparatus 2 is configured with a general-purpose computer apparatus. This computer apparatus includes a central processing unit (CPU), a read only memory (ROM), a random access memory (RAM), a hard disk device, a communication module, a display device, an input device such as a pointing device or a keyboard device (each is not illustrated).

The signal generation apparatus 1 is configured to include a signal generation unit 10 that generates a test signal, a first attenuator 11 that attenuates the test signal generated by the signal generation unit 10, interface units 12a and 12b to which devices under test (DUTs) 3a, 3b, 3c, 3d, 3e, and 3f are respectively connected via cables 4a, 4b, 4c, 4d, 4e, and 4f, and a distributor 13 that distributes the test signal attenuated by the first attenuator 11 to the interface units 12a and 12b.

The signal generation apparatus 1 is configured so that the interface units 12a and 12b are detachable, and the interface units 12a and 12b can be replaced according to test contents and the like.

The interface units 12a and 12b are configured to include a second attenuator 14 that attenuates a test signal output from the distributor 13, a distributor 16 that distributes the test signal attenuated by the second attenuator 14 to third attenuators 15a, 15b, and 15c, the third attenuators 15a, 15b, and 15c that respectively attenuate the test signal output from the distributor 16, output ports 17a, 17b, and 17c that output the test signal attenuated by the third attenuators 15a, 15b, and 15c, and a storage unit 18 that stores attenuation amounts of the first attenuator 11 and the third attenuator 15a, 15b, and 15c.

Further, the signal generation apparatus 1 is configured to include an attenuation amount setting unit that sets the attenuation amounts of the first attenuator 11 and the third attenuators 15a, 15b, and 15c.

In the present embodiment, the cables 4a, 4b, 4c, 4d, 4e, and 4f are configured with, for example, coaxial cables, and the output ports 17a, 17b, and 17c are configured with, for example, coaxial connectors. Although FIG. 1 illustrates an example in which the interface units 12a and 12b have the three output ports 17a, 17b, and 17c, the interface units 12a and 12b may have output ports equal to or more than 2. Further, the signal generation apparatus 1 may accommodate the three or more interface units 12a and 12b.

Each of the output ports 17a, 17b, and 17c can be set to any of valid and invalid by the computer apparatus 2. A test signal is output from an output port that is set to be valid among the respective output ports 17a, 17b, and 17c, and the test signal is not output from an output port that is set to be invalid.

The signal generation unit 10 is configured with a signal generator that generates a test signal for an intensity and a frequency set by the computer apparatus 2. The first attenuator 11 and the third attenuators 15a, 15b, and 15c are configured with a digital control type or voltage control type variable attenuator.

The storage unit 18 is configured with a rewritable non-volatile storage medium such as a flash memory. The storage unit 18 stores the attenuation amounts of the second attenuator 14 and the third attenuators 15a, 15b, and 15c so that output levels of the output ports 17a, 17b, and 17c are equal to each other. Each attenuation amount is set when adjusting the output level of each of the output ports 17a, 17b, and 17c of the individual interface unit 12a and 12b.

The attenuation amount setting unit 19 is configured with, for example, an application specific integrated circuit (ASIC). The attenuation amount setting unit 19 sets the attenuation amount individually for the third attenuators 15a, 15b, and 15c, based on the attenuation amount stored in the storage unit 18.

In the present embodiment, in a case of a Broadcast mode in which signals are simultaneously output from all the output ports 17a, 17b, and 17c at the same signal level, the attenuation amount setting unit 19 corrects an attenuation amount as the interface unit 12b by adding a difference between an attenuation amount of the second attenuator 14 of the interface unit 12a which is a reference and an attenuation amount of the second attenuator 14 of the other interface unit 12b to the attenuation amount of each of the third attenuators 15a, 15b, and 15c of the other interface unit 12b.

In this manner, when the signal levels from the output ports 17a, 17b, and 17c of the interface unit 12a which is the reference are only adjusted by the signal generation unit 10 or the first attenuator 11, the signals can be simultaneously output from all the output ports 17a, 17b, and 17c at the same signal level.

Figure 2:
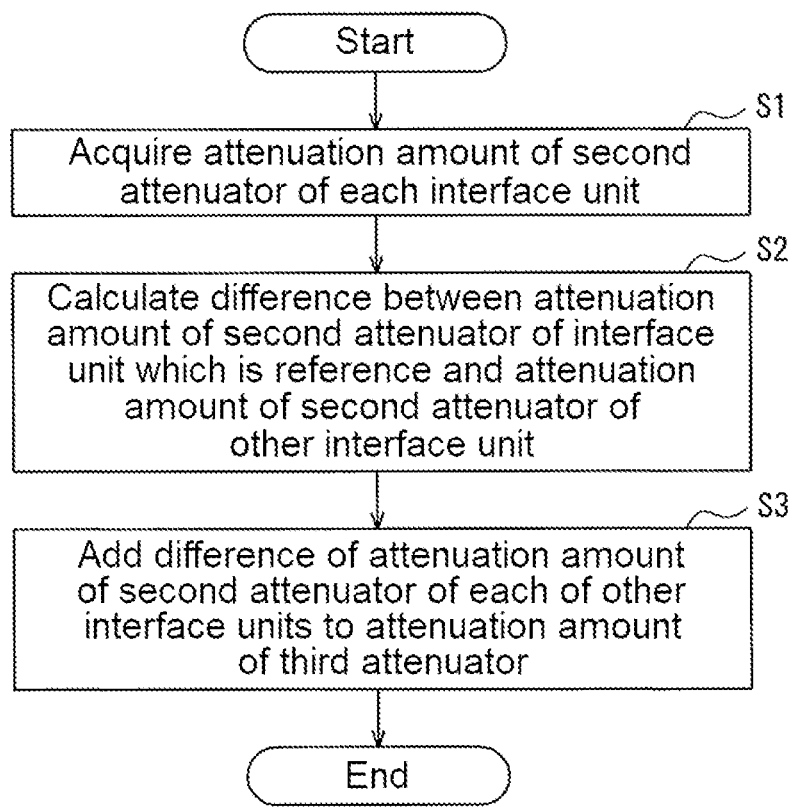
FIG. 2 is a flowchart illustrating a procedure of an attenuation amount correction process of the signal generation apparatus according to the embodiment of the present invention.

An attenuation amount correction process by the signal generation apparatus according to the present embodiment configured as described above will be described with reference to FIG. 2. The attenuation amount correction process to be described below is executed when the Broadcast mode is selected by the computer apparatus 2.

In step S1, the attenuation amount setting unit 19 acquires the attenuation amounts of the second attenuators 14 from the storage unit 18 of each of the interface units 12a and 12b. After executing the process in step S1, the attenuation amount setting unit 19 executes the process in step S2.

In step S2, the attenuation amount setting unit 19 calculates the difference between the attenuation amount of the second attenuator 14 of the interface unit 12a which is the reference and the attenuation amount of the second attenuator 14 of the other interface unit 12b. After executing the process in step S2, the attenuation amount setting unit 19 executes the process in step S3.

In step S3, the attenuation amount setting unit 19 adds the difference of the attenuation amount of the second attenuator 14 of the other interface unit 12b with the interface unit 12a which is the reference, to the attenuation amount of the third attenuators 15a, 15b, and 15c of the other interface unit 12b. After executing the process in step S3, the attenuation amount setting unit 19 ends the attenuation amount correction process.

In this manner, in the embodiment described above, in a case of the Broadcast mode in which signals are simultaneously output from all the output ports 17a, 17b, and 17c at the same signal level, the attenuation amount setting unit 19 corrects an attenuation amount by adding the difference between the attenuation amount of the second attenuator 14 of the interface unit 12a which is the reference and the attenuation amount of the second attenuator 14 of the other interface unit 12b to the attenuation amount of each of the third attenuators 15a, 15b, and 15c of the other interface unit 12b.

As a result, the difference between the attenuation amount of the second attenuator 14 of the interface unit 12a which is the reference and the attenuation amount of the second attenuator 14 of the other interface unit 12b is corrected with the attenuation amounts of the respective third attenuators 15a, 15b, and 15c of the other interface unit 12b. Therefore, even in a configuration in which a plurality of interface units 12a and 12b can be accommodated, the output signal levels can be adjusted in a short time in a case where the signals are simultaneously output from all the output ports 17a, 17b, and 17c at the same signal level.

Although the embodiment of the present invention is disclosed, it is apparent that the embodiment can be modified by those skilled in the art without departing from the scope of the invention. All such modifications and equivalents are intended to be included in the following claims.

DESCRIPTION OF REFERENCE NUMERALS AND SIGNS

1 Signal generation apparatus
10 Signal generation unit
11 First attenuator
12a, 12b Interface unit
13 Distributor
14 Second attenuator
15a, 15b, 15c Third attenuator
16 Distributor
17a, 17b, 17c Output port
18 Storage unit
19 Attenuation amount setting unit

What is claimed is:

1. A signal generation apparatus comprising:
a signal generation unit that generates a test signal;
a first attenuator that attenuates the signal generated by the signal generation unit;
a plurality of interface units that distribute the signal attenuated by the first attenuator to a plurality of output ports,
the interface unit including
a second attenuator that attenuates the signal attenuated by the first attenuator,
a distributor that distributes the signal attenuated by the second attenuator to the plurality of output ports,
a plurality of third attenuators that attenuate the signals output from the distributor, respectively, and
a storage unit that stores attenuation amounts of the second attenuator and each of the plurality of third attenuators so that output levels of the plurality of output ports are equal to each other; and
an attenuation amount setting unit that sets, in a case where all the output ports of the plurality of interface units simultaneously output the signals at the same signal level, one of the plurality of interface units as a reference interface unit, and adds a difference between the attenuation amount of the second attenuator stored in the storage unit of the reference interface unit and the attenuation amount of the second attenuator stored in the storage unit of the other interface unit to the attenuation amount of each of the plurality of third attenuators of the other interface unit to correct the attenuation amount.

2. An attenuation amount correction method of a signal generation apparatus including a signal generation unit that generates a test signal, a first attenuator that attenuates the signal generated by the signal generation unit, and a plurality of interface units that distribute the signal attenuated by the first attenuator to a plurality of output ports, the interface unit including a second attenuator that attenuates the signal attenuated by the first attenuator, a distributor that distributes the signal attenuated by the second attenuator to the plurality of output ports, a plurality of third attenuators that attenuate the signals output from the distributor, respectively, and a storage unit that stores attenuation amounts of the second attenuator and each of the plurality of third attenuators so that output levels of the plurality of output ports are equal to each other, the method comprising:
setting one of the plurality of interface units as a reference interface unit, and calculating a difference between the attenuation amount of the second attenuator stored in the storage unit of the reference interface unit and the attenuation amount of the second attenuator stored in the storage unit of the other interface unit; and
adding the difference between the attenuation amount of the second attenuator stored in the storage unit of each of the other interface units and the attenuation amount of the second attenuator stored in the storage unit of the reference interface unit to the attenuation amount of each of the plurality of third attenuators to correct the attenuation amount.

* * * * *